United States Patent
Schuster et al.

(10) Patent No.: US 10,009,000 B2
(45) Date of Patent: Jun. 26, 2018

(54) RFID READER ANTENNA PORT ISOLATION

(71) Applicant: INTERMEC, INC., Lynnwood, WA (US)

(72) Inventors: Thomas John Schuster, Cedar Rapids, IA (US); John Jorgenson, Cedar Rapids, IA (US); Fengyu Ge, Cedar Rapids, IA (US)

(73) Assignee: INTERMEC, INC., Lynnwood, WA (US)

( * ) Notice: Subject to any disclaimer, the term of this patent is extended or adjusted under 35 U.S.C. 154(b) by 0 days. days.

(21) Appl. No.: 14/972,625

(22) Filed: Dec. 17, 2015

(65) Prior Publication Data

US 2016/0180125 A1 Jun. 23, 2016

Related U.S. Application Data

(60) Provisional application No. 62/095,468, filed on Dec. 22, 2014.

(51) Int. Cl.
| | |
|---|---|
| *G06K 7/10* | (2006.01) |
| *H03H 7/38* | (2006.01) |
| *H01Q 1/22* | (2006.01) |
| *H01Q 1/52* | (2006.01) |

(52) U.S. Cl.
CPC .......... *H03H 7/38* (2013.01); *G06K 7/10356* (2013.01); *H01Q 1/2216* (2013.01); *H01Q 1/521* (2013.01); *G06K 7/10217* (2013.01)

(58) Field of Classification Search
USPC .............. 235/451; 455/73, 77; 343/700
See application file for complete search history.

(56) References Cited

U.S. PATENT DOCUMENTS

| | | | |
|---|---|---|---|
| 2005/0001769 A1* | 1/2005 | Qi | H01Q 1/243 343/700 MS |
| 2011/0050164 A1* | 3/2011 | Partovi | H01F 5/003 320/108 |
| 2011/0181342 A1* | 7/2011 | Uejima | H04B 1/0057 327/416 |
| 2011/0193652 A1* | 8/2011 | Wu | H03H 7/38 333/105 |
| 2012/0164964 A1* | 6/2012 | Kwon | H04B 7/086 455/226.1 |
| 2013/0052967 A1* | 2/2013 | Black | H04B 1/18 455/77 |
| 2013/0316662 A1* | 11/2013 | Bengtsson | H04B 7/0874 455/77 |
| 2014/0022125 A1* | 1/2014 | Zhu | H01Q 3/2611 342/377 |
| 2014/0062613 A1* | 3/2014 | Wolfson | H01P 1/127 333/103 |
| 2014/0125535 A1* | 5/2014 | Ramachandran | H01Q 1/243 343/745 |
| 2014/0273887 A1* | 9/2014 | Black | H03H 7/40 455/77 |

(Continued)

*Primary Examiner* — Allyson Trail
(74) *Attorney, Agent, or Firm* — Oliff PLC; R. Brian Drozd

(57) ABSTRACT

A device includes a switch having multiple ports, an antenna coupled to each corresponding port, a tunable matching network coupled between each antenna and each port, and a controller to detune ports having antennas that are not transferring power when a selected antenna is transferring power.

21 Claims, 3 Drawing Sheets

(56) References Cited

U.S. PATENT DOCUMENTS

2015/0028963 A1* 1/2015 Ebihara .................. H03H 7/465
                                                    333/126
2015/0048979 A1* 2/2015 Asrani .................. H01Q 5/0093
                                                    343/702
2015/0365877 A1* 12/2015 Leather ................ H04L 49/101
                                                    370/328

* cited by examiner

RFID READER ANTENNA PORT ISOLATION

CROSS-REFERENCE TO RELATED APPLICATION

This nonprovisional application claims the benefit of U.S. Provisional Application No. 62/095,468, filed Dec. 22, 2014 which is herein incorporated by reference in its entirety.

BACKGROUND

Multiport (antenna) RFID readers must have good isolation between antenna ports to reduce tag reads on the unintended port. Tag sensitivities are getting better requiring even more isolation between ports. Currently isolation is achieved with the RF switches. Higher isolation means more expensive and higher loss switches and there is a practical limit to switch isolation.

SUMMARY

The present application solves the above issues and allows for selecting (e.g., by tuning) one or more antennas and/or deselecting (e.g., by detuning) other antennas.

According to one embodiment, a method may include: selecting a port of a multiport switch on which to transfer energy via an antenna coupled to the selected port; detuning impedances corresponding to antennas coupled to non-selected ports; and transferring energy via the antenna coupled to the selected port.

According to another embodiment, a device may include: a switch having multiple ports, an antenna coupled to each corresponding port, a tunable matching network coupled between each antenna and each port, and a controller to detune ports having antennas that are not transferring power when a selected antenna is transferring power.

According to yet another embodiment, a system may include: an RFID reader signal path; a switch having multiple ports coupled to the RFID reader signal path; an antenna coupled to each corresponding port; a tunable matching network coupled between each antenna and each port and coupled to the RFID reader controller; and a controller to control the switch and the tunable impedances to detune the tunable impedances coupled to antennas that are not transferring power when a selected antenna is transferring power.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of software and human implemented procedures in one embodiment. The software may consist of computer executable instructions stored on computer readable media or computer readable storage device such as one or more memory or other type of hardware based storage devices, either local or networked. Further, such functions correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

Higher isolation of multiport RFID reader antennas is achieved by actively detuning ports not being transmitted on. Some RFID applications require the knowledge of which antenna the tag was read on for proper operation. For instance, tracking if the tag is entering or exiting a portal by knowing the tag was read on antenna 1 and then on antenna 2. There are environments where reflections or tag to antenna proximity can cause the signal to appear larger on the antenna that is physically further away from the tag. This will cause failures and incorrect information input to an application receiving information from the RFID reader. The higher the isolation between the ports the less likely these failures occur. Using isolation switches alone, there is a practical limit to the achievable isolation. By actively detuning the antenna ports that are not energized with RF signal, the likelihood of misreads can be reduced by increasing isolation in addition to the switch isolation. Tag and reader sensitivities continue to improve, and enhanced RF switch isolation reduces failures.

Figure 1:
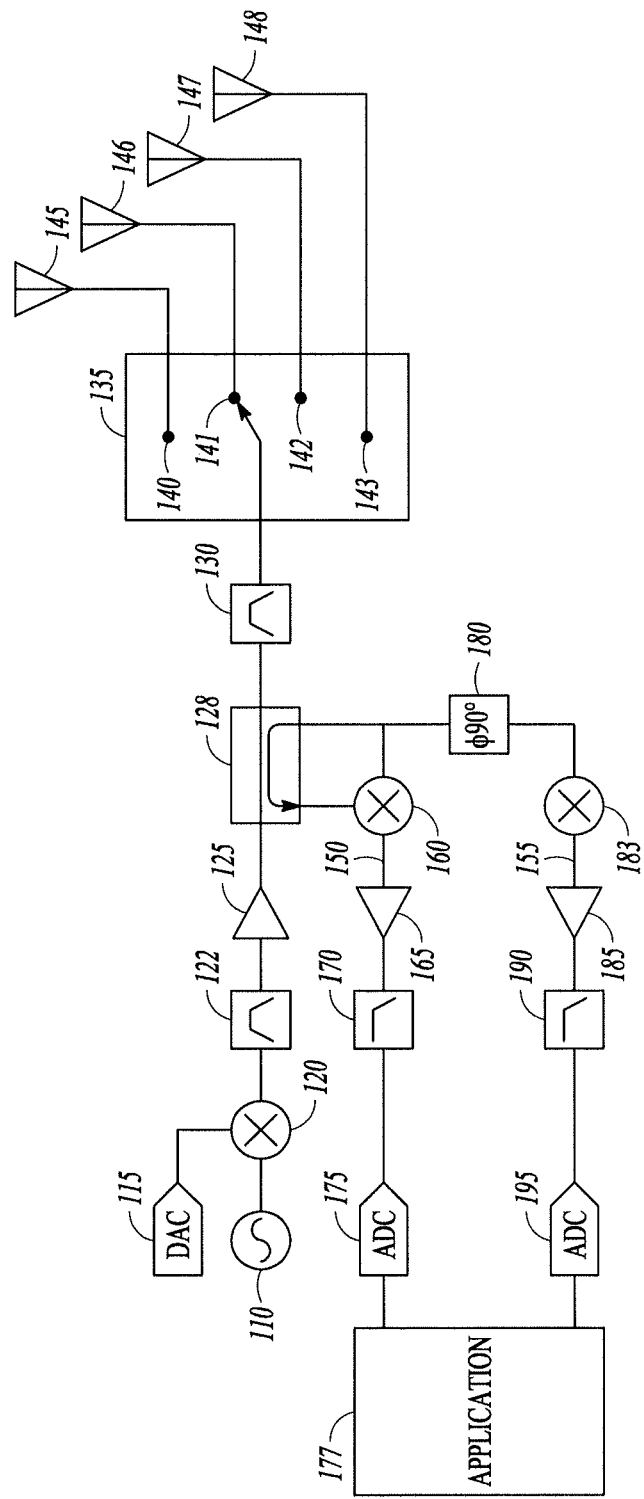
FIG. 1 is a block schematic diagram of an RFID reader having detuning elements according to an example embodiment.

FIG. 1 is a block schematic diagram of an RFID reader indicated generally at 100. The RFID reader transmits a signal on a first path consisting of a frequency generator 110, a digital to analog converter 115 to modulate the signal to create a read signal, a mixer 120 to add the signal from the frequency generator 110 and DAC 115, a band pass filter 122, amplifier 125, splitter 128 and low pass filter 130. The first path is connected to a common switch port 135 having multiple ports 140, 141 142, 143 to selectively couple to multiple antennas 145, 146, 147, 148 respectively to transmit read signals from the first path.

The antennas also receive signals from RFID tags responsive to the read signals. The received signals are transmitted back through low pass filter 130, and are then coupled to two receive signals paths 150 and 155 via splitter 128 in one embodiment. Path 150 includes a mixer 160 coupled to an amplifier 165, low pass filter 170 and analog to digital converter (ADC) 175, to provide signals to an application 177.

Path 155 includes a phase shifter 180 to shift the received signal 90 degrees, a mixer 183, amplifier 185, low pass filter 190 and ADC 195.

Figure 2:
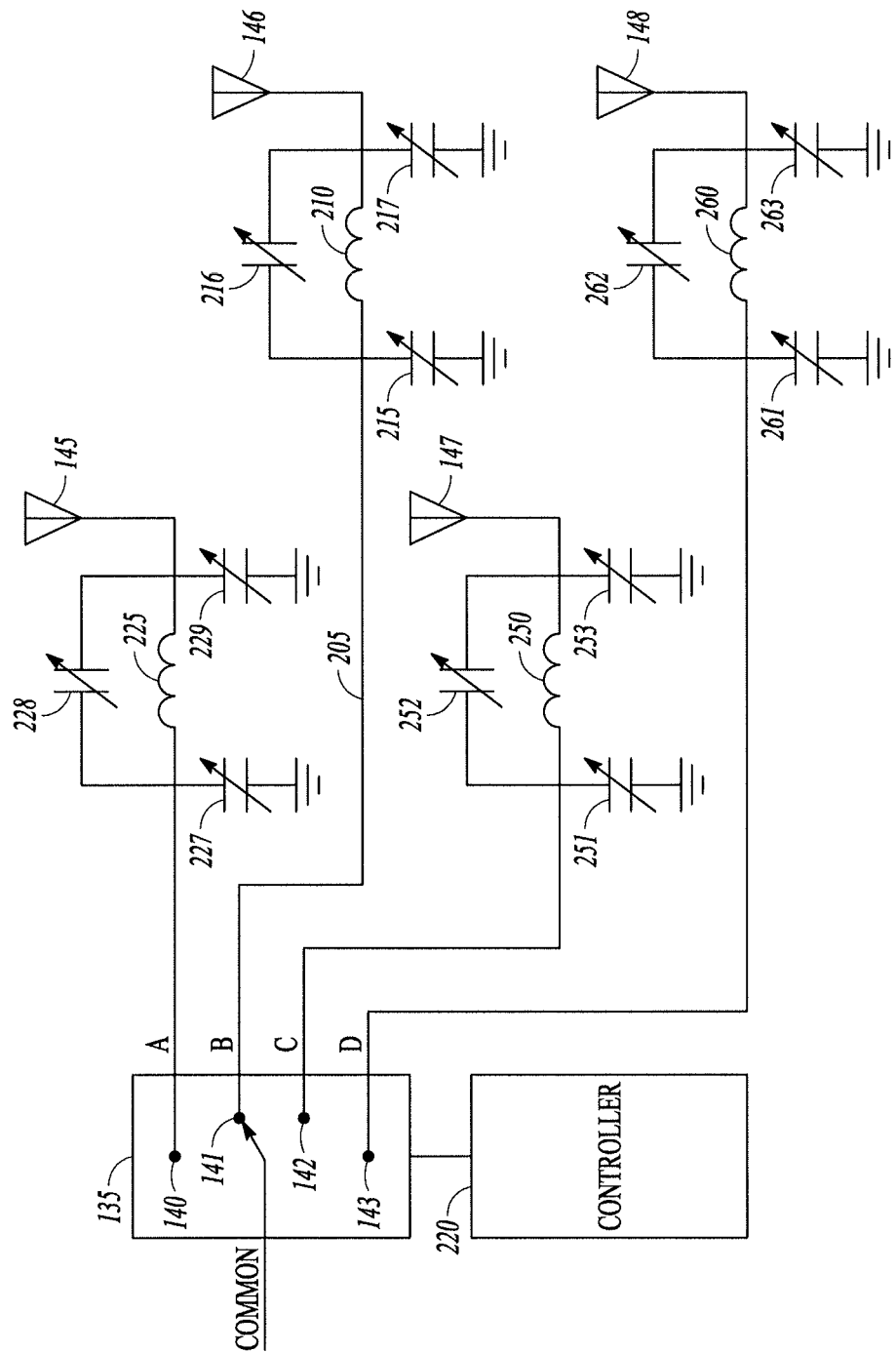
FIG. 2 is a block schematic diagram of a port switch and multiple antennas with tunable impedances according to an example embodiment.

FIG. 2 is a block schematic diagram illustrating the common switch port set 135 to selecting port 141 corresponding to antenna 146. Antenna 146 is coupled to port 141 via a feed line 205 having an inductor represented at 210. Tunable elements are indicated at 215, 216, and 217 as variable capacitors. In one embodiment, inductor 210 may also be a tunable element. Capacitor 215 is coupled between a first side of inductor 210 and ground. Capacitor 217 is coupled between a second side of inductor 210 and ground. Capacitor 216 is coupled in parallel with inductor 210. One or more of the tunable elements may be variable. In one embodiment, a tunable element may include a high Q capacitor. A controller 220 is coupled to control the common switch port set 135 and the tunable elements. The connections to the tunable elements are not shown for simplicity of illustration.

In one embodiment, one or more tunable elements for the selected antenna 146 are tuned to match the impedance of the line 205 to provide a best match for power transfer to the antenna 146. Each of the other antennas also have corresponding tunable elements that are tuned to mismatch the antennas to the switch ports to achieve the lowest power transfer, corresponding to the highest isolation from the antennas. This process is known as detuning the antennas, according to one embodiment. In another embodiment, detuning the antennas may be performed by changing the input impedance or mismatching the impedances of each respective antenna to its energy source so that the antenna is closer to or is an open circuit to the energy source. In this regard, energy from the energy source is not transmitted by the antenna or is reduced by the amount of detuning that has been performed.

The tunable elements for antenna 145 include inductor 225 and variable capacitors 227, 228, and 229. The tunable elements for antenna 147 include inductor 250 and variable capacitors 251, 252, and 253. The tunable elements for antenna 148 include inductor 260 and variable capacitors 261, 262, and 263.

In one embodiment, detuning the antennas not transmitting may add an additional 10 to 20 dB of isolation to the isolation already provided by the switch and antenna separation. Similarly, when antenna 145 is selected, antennas 146, 147, and 148 are detuned, while antenna 145 is tuned. Similar detuning of non-transmitting antennas and tuning of the selected antenna occurs when antennas 147 or 148 are selected. Note that the tunable elements may be part of the antenna or the feed line between the antenna and a corresponding port. The particular configuration and location of the tunable elements comprising a matching network may be varied in further embodiments to provide isolation.

In one embodiment, controller 220 operates to select the port and corresponding antenna for transmission, while at the same time, tuning the tunable elements for the selected antenna while detuning the tunable elements for the non-selected antennas. The tuning values to use may be stored in a table or hard coded into software operating on the controller in various embodiments. Such values may be selected at time of manufacture, and may be selected empirically for each multiport RFID reader to detune the non-transmitting antennas to a frequency of low anticipated energy during normal use, such as by avoiding harmonics of the transmission frequency.

Figure 3:
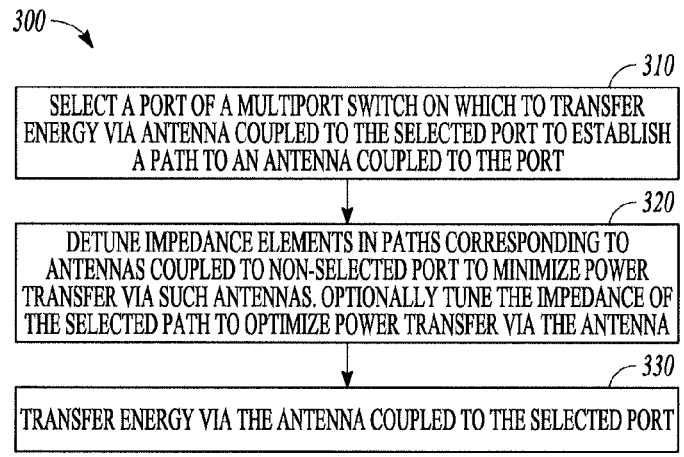
FIG. 3 is a flowchart illustrating a method of detuning impedances for optimal antenna isolation according to an example embodiment.

FIG. 3 is a flowchart illustrating a method 300 of operation of controller 220 in one embodiment. Method 300 in one embodiment starts at 310 by selecting a port of a multiport switch on which to transfer energy via an antenna coupled to the selected port. The controller may receive the port selection, or generate the selection itself in accordance with an RFID locator algorithm that selects different ports to locate different RFID tags. Once the port is selected, and a path to the corresponding antenna established by the selection, impedance elements in paths corresponding to antennas coupled to non-selected ports are detuned at 320. In various embodiments, the impedance elements comprise an inductor and one or more series or shunt coupled capacitors. One or more of the capacitors may be have a capacitance modified to accomplish the detuning. The capacitors may include high Q capacitors. While the impedance elements in non-selected paths may be detuned, in some embodiments, the impedance of the selected path may be tuned to optimize power transfer via the antenna. In further embodiments, many different arrangements of impedance elements may be utilized that are tunable to minimize power transfer via antennas in non-selected paths to provide further isolation of such antennas. Once the impedance elements are detuned, energy may be transferred at 330 via the antenna coupled to the selected port.

Figure 4:
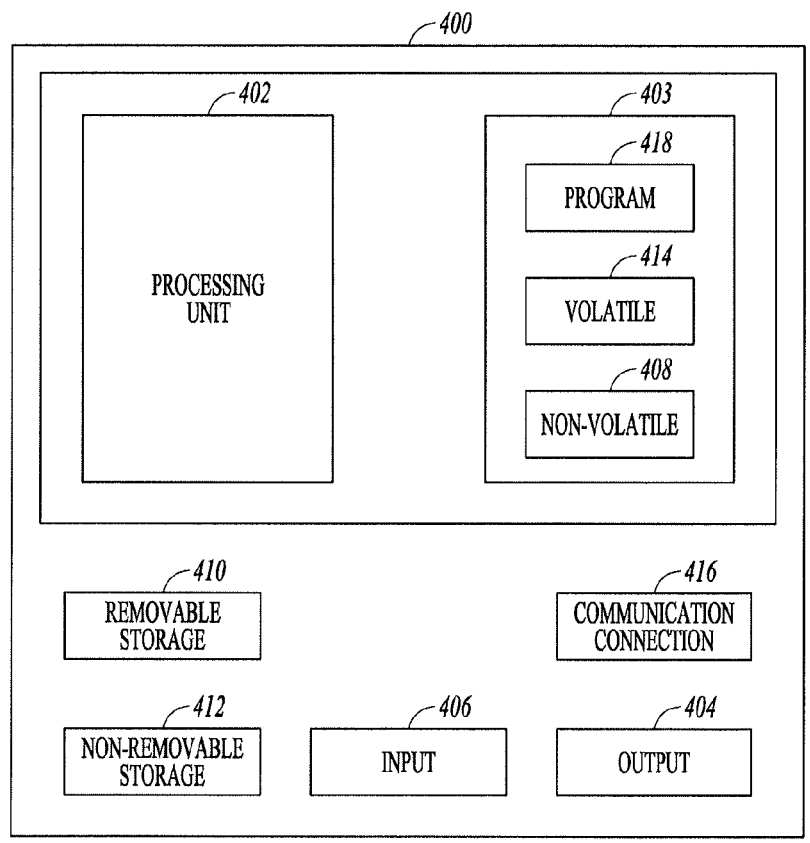
FIG. 4 is a block schematic diagram of a computer system for implementing example embodiments.

FIG. 4 is a block schematic diagram of a computer system 400 to implement methods according to example embodiments. All components need not be used in various embodiments. One example computing device in the form of a computer 400, may include a processing unit 402, memory 403, removable storage 410, and non-removable storage 412. Although the example computing device is illustrated and described as computer 400, the computing device may be in different forms in different embodiments. For example, the computing device may instead be a smartphone, a tablet, smartwatch, or other computing device including the same or similar elements as illustrated and described with regard to FIG. 4. Devices such as smartphones, tablets, and smartwatches are generally collectively referred to as mobile devices. Further, although the various data storage elements are illustrated as part of the computer 400, the storage may also or alternatively include cloud-based storage accessible via a network, such as the Internet.

Memory 403 may include volatile memory 414 and non-volatile memory 408. Computer 400 may include—or have access to a computing environment that includes—a variety of computer-readable media, such as volatile memory 414 and non-volatile memory 408, removable storage 410 and non-removable storage 412. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions.

Computer 400 may include or have access to a computing environment that includes input 406, output 404, and a communication connection 416. Output 404 may include a display device, such as a touchscreen, that also may serve as an input device. The input 406 may include one or more of a touchscreen, touchpad, mouse, keyboard, camera, one or more device-specific buttons, one or more sensors integrated within or coupled via wired or wireless data connections to the computer 400, and other input devices. The computer may operate in a networked environment using a communication connection to connect to one or more remote computers, such as database servers. The remote computer may include a personal computer (PC), server, router, network PC, a peer device or other common network node, or the like. The communication connection may include a Local Area Network (LAN), a Wide Area Network (WAN), cellular, WiFi, Bluetooth, or other networks.

Computer-readable instructions stored on a computer-readable medium are executable by the processing unit 402 of the computer 400. A hard drive, CD-ROM, and RAM are some examples of articles including a non-transitory computer-readable medium such as a storage device. The terms computer-readable medium and storage device do not include carrier waves. For example, a computer program 418 capable of providing a generic technique to perform access control check for data access and/or for doing an operation on one of the servers in a component object model (COM) based system may be included on a CD-ROM and loaded from the CD-ROM to a hard drive. The computer-readable instructions allow computer 400 to provide generic access controls in a COM based computer network system having multiple users and servers.

EXAMPLES

1. A device comprising:
   a switch having multiple ports;
   an antenna coupled to each corresponding port;
   a tunable matching network coupled between each antenna and each port; and
   a controller that controls the tunable matching network to detune ports having antennas that are not transferring power when a selected antenna is transferring power.

2. The device of example 1 wherein the controller tunes a tunable impedance of the matching network on the selected port to optimize antenna power transfer.

3. The device of any of examples 1-2 wherein a tunable impedance of the matching network comprises one or multiple tunable capacitors.

4. The device of example 3 wherein the tunable capacitor comprises a high Q capacitor.

5. The device of any of examples 1-4 wherein a tunable impedance of the matching network comprises:
   an inductor; and
   an adjustable capacitor coupled in parallel with the inductor.

6. The device of any of examples 1-5 wherein a tunable impedance of the matching network comprises:
   an inductor;
   a first capacitor coupled between one side of the inductor and ground; and
   a second capacitor coupled between another side of the inductor and ground, wherein at least one of the first and second capacitors is adjustable.

7. The device of any of examples 1-6 wherein a tunable impedance of the matching network comprises:
   an inductor;
   a first capacitor coupled between one side of the inductor and ground;
   a second capacitor coupled between another side of the inductor and ground; and
   a third capacitor coupled in parallel with the inductor, wherein at least one of the first, second, and third capacitors is adjustable.

8. The device of example 7 wherein each of the first, second, and third capacitors is adjustable.

9. A system comprising:
   an RFID reader signal path;
   a switch having multiple ports coupled to the RFID reader signal path;
   an antenna coupled to each corresponding port;
   a tunable matching network coupled between each antenna and each port and coupled to the RFID reader controller; and
   a controller to control the switch and the tunable impedances to detune the tunable impedances coupled to antennas that are not transferring power when a selected antenna is transferring power.

10. The system of example 9 wherein the controller tunes a tunable impedance of the matching network on the selected port to optimize antenna power transfer.

11. The system of any of examples 9-10 wherein a tunable impedance of the matching network comprises a tunable high Q capacitor.

12. The system of any of examples 9-10 wherein a tunable impedance of the matching network comprises:
   an inductor; and
   an adjustable capacitor coupled in parallel with the inductor.

13. The system of any of examples 9-12 wherein a tunable impedance of the matching network comprises:
   an inductor;
   a first capacitor coupled between one side of the inductor and ground; and
   a second capacitor coupled between another side of the inductor and ground, wherein at least one of the first and second capacitors is adjustable.

14. The system of any of examples 9-13 wherein a tunable impedance of the matching network comprises:
   an inductor;
   a first capacitor coupled between one side of the inductor and ground;
   a second capacitor coupled between another side of the inductor and ground; and
   a third capacitor coupled in parallel with the inductor, wherein at least one of the first, second, and third capacitors is adjustable.

15. The system of example 14 wherein each of the first, second, and third capacitors is adjustable.

16. A method comprising:
   selecting a port of a multiport switch on which to transfer energy via an antenna coupled to the selected port;
   detuning impedances corresponding to antennas coupled to non-selected ports; and
   transferring energy via the antenna coupled to the selected port.

17. The method of example 16 and further comprising ensuring an impedance between the selected port and corresponding antenna is tuned for optimal power transfer.

18. The method of any of examples 16-17 wherein the impedances comprise high Q tunable capacitors.

19. The method of any of examples 16-18 wherein the impedances comprise
   an inductor;
   a first capacitor coupled between one side of the inductor and ground;
   a second capacitor coupled between another side of the inductor and ground; and
   a third capacitor coupled in parallel with the inductor, wherein detuning the impedance comprises adjusting the capacitance of at least one of the first, second, and third capacitors.

20. The method of any of examples 16-19 wherein each of the first, second, and third capacitors is adjusted.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The following statements are potential claims that may be converted to claims in a future application. No modification of the following statements should be allowed to affect the interpretation of claims which may be drafted when this provisional application is converted into a regular utility application.

The invention claimed is:

1. A device comprising:
   a switch having multiple ports and configured to select one port at a time;
   a plurality of antennas that are respectively coupled to corresponding ports;
   a tunable matching network coupled between each of the plurality of antennas and each of the ports; and
   a controller that selects a first port in the switch so that a selected antenna associated with the first port transfers power while antennas on ports not selected do not transfer power, the controller further configured to control the tunable matching network to change tunable impedances in accordance with tunable values stored in a database to detune tunable impedances coupled to ports of the antennas that are not transferring power when the selected antenna is transferring power.

2. The device of claim 1 wherein the controller tunes a tunable impedance of the matching network on the selected port to optimize antenna power transfer, wherein the controller detunes the ports by changing the input impedance to each antenna that is to be detuned.

3. The device of claim 1 wherein a tunable impedance of the matching network comprises one or multiple tunable capacitors.

4. The device of claim 3 wherein the tunable capacitor comprises a high Q capacitor.

5. The device of claim 1 wherein a tunable impedance of the matching network comprises:
   an inductor; and
   an adjustable capacitor coupled in parallel with the inductor.

6. The device of claim 1 wherein a tunable impedance of the matching network comprises:
   an inductor;
   a first capacitor coupled between one side of the inductor and ground; and
   a second capacitor coupled between another side of the inductor and ground, wherein at least one of the first and second capacitors is adjustable.

7. The device of claim 1 wherein a tunable impedance of the matching network comprises:
   an inductor;
   a first capacitor coupled between one side of the inductor and ground;
   a second capacitor coupled between another side of the inductor and ground; and
   a third capacitor coupled in parallel with the inductor, wherein at least one of the first, second, and third capacitors is adjustable.

8. The device of claim 7 wherein each of the first, second, and third capacitors is adjustable.

9. A system comprising:
   an RFID reader signal path;
   a switch having multiple ports coupled to the RFID reader signal path and configured to select one port at a time;
   an antenna coupled to each corresponding port;
   a tunable matching network coupled between each antenna and each port and coupled to the RFID reader controller; and
   a controller configured to control the switch to select a first port in the switch so that a selected antenna associated with the first port transfers power while antennas on ports not selected do not transfer power, the controller further configured to control the tunable impedances in accordance with tunable values stored in a database to detune the tunable impedances coupled to ports of the antennas that are not transferring power when a selected antenna is transferring power.

10. The system of claim 9 wherein the controller tunes a tunable impedance of the matching network on the selected port to optimize antenna power transfer.

11. The system of claim 9 wherein a tunable impedance of the matching network comprises a tunable high Q capacitor.

12. The system of claim 9 wherein a tunable impedance of the matching network comprises:
    an inductor; and
    an adjustable capacitor coupled in parallel with the inductor.

13. The system of claim 9 wherein a tunable impedance of the matching network comprises:
    an inductor;
    a first capacitor coupled between one side of the inductor and ground; and
    a second capacitor coupled between another side of the inductor and ground, wherein at least one of the first and second capacitors is adjustable.

14. The system of claim 9 wherein a tunable impedance of the matching network comprises:
    an inductor;
    a first capacitor coupled between one side of the inductor and ground;
    a second capacitor coupled between another side of the inductor and ground; and
    a third capacitor coupled in parallel with the inductor, wherein at least one of the first, second, and third capacitors is adjustable.

15. The system of claim 14 wherein each of the first, second, and third capacitors is adjustable which is used in detuning the ports by changing the input impedance to each antenna that is to be detuned.

16. A method comprising:
    selecting a port of a multiport switch on which to transfer energy via an antenna coupled to the selected port so that a selected antenna associated with the first port transfers power while antennas on ports non-selected do not transfer power;
    detuning impedances corresponding to the antennas coupled to the non-selected ports, in accordance with tunable values stored in a database; and
    transferring energy via the antenna coupled to the selected port.

17. The method of claim 16 and further comprising ensuring an impedance between the selected port and corresponding antenna is tuned for optimal power transfer.

18. The method of claim 16 wherein the impedances comprise high Q tunable capacitors.

19. The method of claim 16 wherein the impedances comprise an inductor;
    a first capacitor coupled between one side of the inductor and ground;
    a second capacitor coupled between another side of the inductor and ground; and a third capacitor coupled in parallel with the inductor,
      wherein detuning the impedance comprises adjusting the capacitance of at least one of the first, second, and third capacitors.

20. The method of claim 19, wherein each of the first, second, and third capacitors is adjusted.

21. The device of claim 1, wherein the multiport switch comprises (1) a plurality of ports which each connect a different antenna from a plurality of separate antennas, and (2) a switch that is configured to alternatively select only one of the plurality of ports so that only one of the plurality of separate antennas is selected for transmission at a time.

* * * * *